United States Patent [19]
Pascucci et al.

[11] Patent Number: 5,768,115
[45] Date of Patent: Jun. 16, 1998

[54] VOLTAGE BOOSTER WITH AN ACCELERATION CIRCUIT

[75] Inventors: Luigi Pascucci, Sesto San Giovanni; Silvia Padoan, Rimini; Carla Maria Golla, Sesto San Giovanni, all of Italy

[73] Assignee: SGS-Thomson Microelectronics S.r.l., Agrate Brianza, Italy

[21] Appl. No.: 855,922

[22] Filed: May 14, 1997

Related U.S. Application Data

[63] Continuation of Ser. No. 365,284, Dec. 28, 1994, abandoned.

[30] Foreign Application Priority Data

Dec. 28, 1993 [DE] Germany .............. 938 30 525.7

[51] Int. Cl.$^6$ .............. H02M 3/18; G05F 1/40
[52] U.S. Cl. .............. 363/59; 323/284; 307/110
[58] Field of Search .............. 363/59, 60, 61; 323/284; 307/110; 320/1

[56] References Cited

U.S. PATENT DOCUMENTS

| | | | |
|---|---|---|---|
| 4,752,699 | 6/1988 | Cranford, Jr. et al. | 307/297 |
| 4,769,784 | 9/1988 | Doluca et al. | |
| 4,933,827 | 6/1990 | Olivo | 363/60 |
| 5,029,269 | 7/1991 | Elliott et al. | 363/21 |
| 5,059,815 | 10/1991 | Bill et al. | 307/246 |
| 5,168,174 | 12/1992 | Naso et al. | |
| 5,394,320 | 2/1995 | Blodgett | 363/60 |
| 5,526,253 | 6/1996 | Duley | 363/59 |

FOREIGN PATENT DOCUMENTS

| | | | |
|---|---|---|---|
| A-57 060 711 | 7/1982 | Japan | H03F 3/45 |
| A-59 050 556 | 6/1984 | Japan | H01L 27/08 |
| A-61 100 010 | 5/1986 | Japan | H03F 3/45 |

*Primary Examiner*—Peter S. Wong
*Assistant Examiner*—Bao Q. Vu
*Attorney, Agent, or Firm*—David V. Carlson; Michael J. Donohue

[57] ABSTRACT

A voltage booster comprising a charge pump for generating a boost voltage over a boost line. The booster comprises a comparator which is supplied by a voltage divider with a voltage proportional to the boost voltage, and by a reference source with a low reference voltage, and which, depending on the outcome of the comparison, enables or disables the charge pump. A voltage limiter is connected between the boost line and ground; and a acceleration circuit accelerates the voltage increase on the acceleration line following low-power operation in which the paths toward ground are interrupted for reducing consumption.

26 Claims, 3 Drawing Sheets

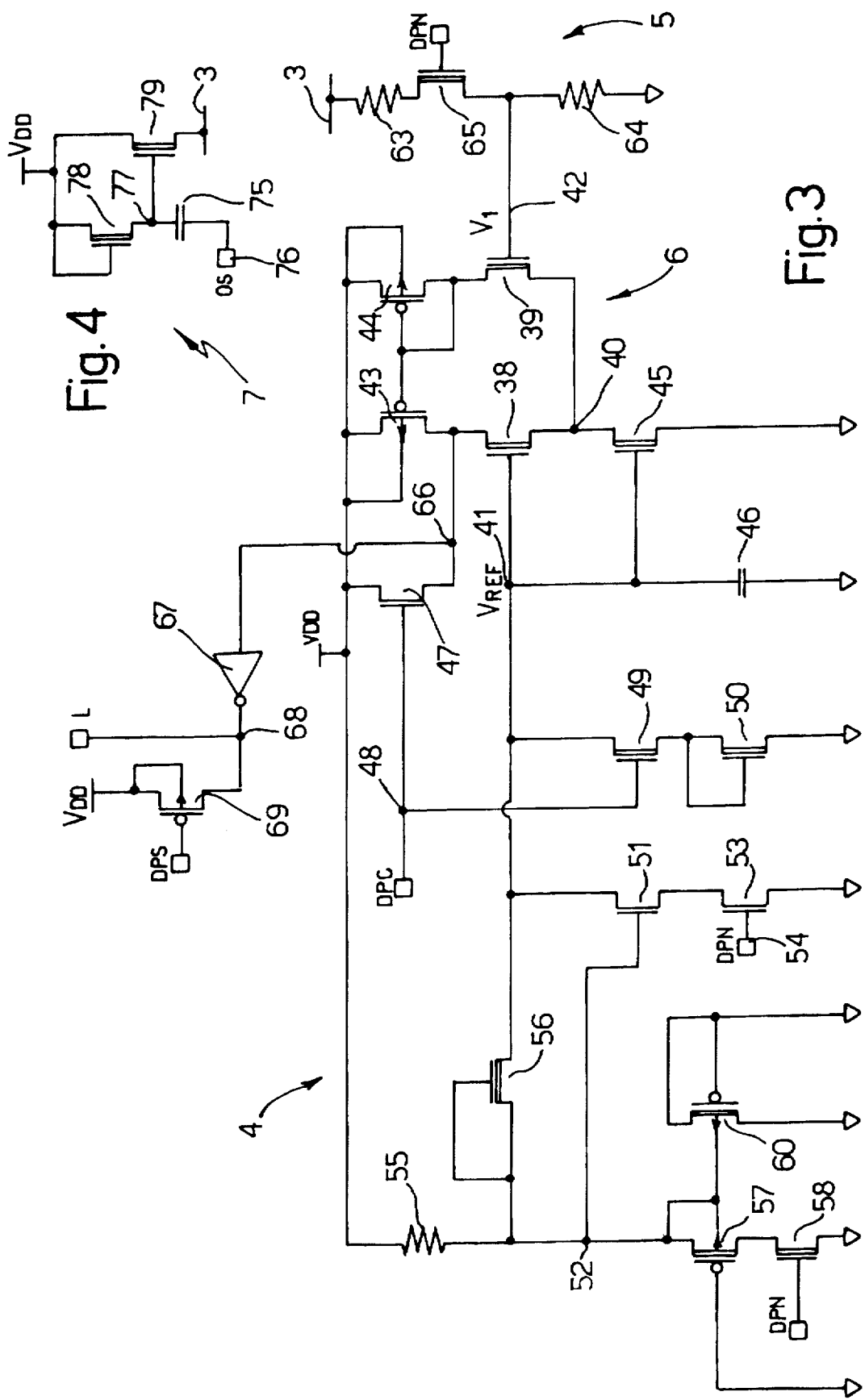

/ 1

VOLTAGE BOOSTER WITH AN ACCELERATION CIRCUIT

CROSS-REFERENCE TO RELATED APPLICATION

This application is a continuation of U.S. patent application No. 08/365,284, filed Dec. 28, 1994, now abandoned.

TECHNICAL FIELD

The present invention relates to a voltage booster, particularly for nonvolatile memories such as flash-EEPROMs.

BACKGROUND OF THE INVENTION

As is known, a voltage booster provides for generating a voltage (Vboost) greater than the supply voltage and ranging between a specified maximum and minimum value. This is important, for example, in the case of flash memories with a supply voltage of 3 V, in which case a gate voltage in excess of supply voltage and equal to the boost voltage is required for reading the storage cells.

Known voltage boosters comprise a charge pump circuit for generating the desired boost voltage, and at present operate with a predetermined supply voltage so that the charge pump circuit is designed to supply pulses of a given value for achieving the required voltage, and is turned off automatically at the end of the pulses.

As a result, known voltage boosters are necessarily designed according to the supply voltage and the characteristics of the device of which they form part, and do not always provide for a high degree of precision in conditions involving a certain amount of variation in the pulses supplied by the charge pump or in the characteristics of the lines supplied with the boost voltage (e.g. charge conditions).

Unless appropriately adapted, therefore, known voltage boosters cannot be employed, as desired at present, in memories operating at different supply voltages.

It is an object of the present invention to provide a voltage booster designed to overcome the drawbacks typically associated with known circuits, and which in particular provides for supplying a desired boost voltage regardless of supply voltage (within a specified minimum and maximum limit), regardless of varying conditions of the components with which it cooperates, and with no adaptation or adjustment required.

SUMMARY OF THE INVENTION

According to the present invention, there is provided a voltage booster as claimed. The voltage booster includes a charge pump circuit connected to a boost line presenting a boost voltage, and enabling means for turning the charge pump circuit on and off when the boost voltage is respectively below and above predetermined limits.

BRIEF DESCRIPTION OF THE DRAWINGS

A preferred, non-limiting embodiment of the present invention will be described by way of example with reference to the accompanying drawings, in which:

FIG. 3 shows a circuit diagram of a reference source, differential amplifier, and divider in FIG. 1;

FIG. 4 shows a circuit diagram of a acceleration circuit in FIG. 1;

DETAILED DESCRIPTION OF THE INVENTION

Figure 1:
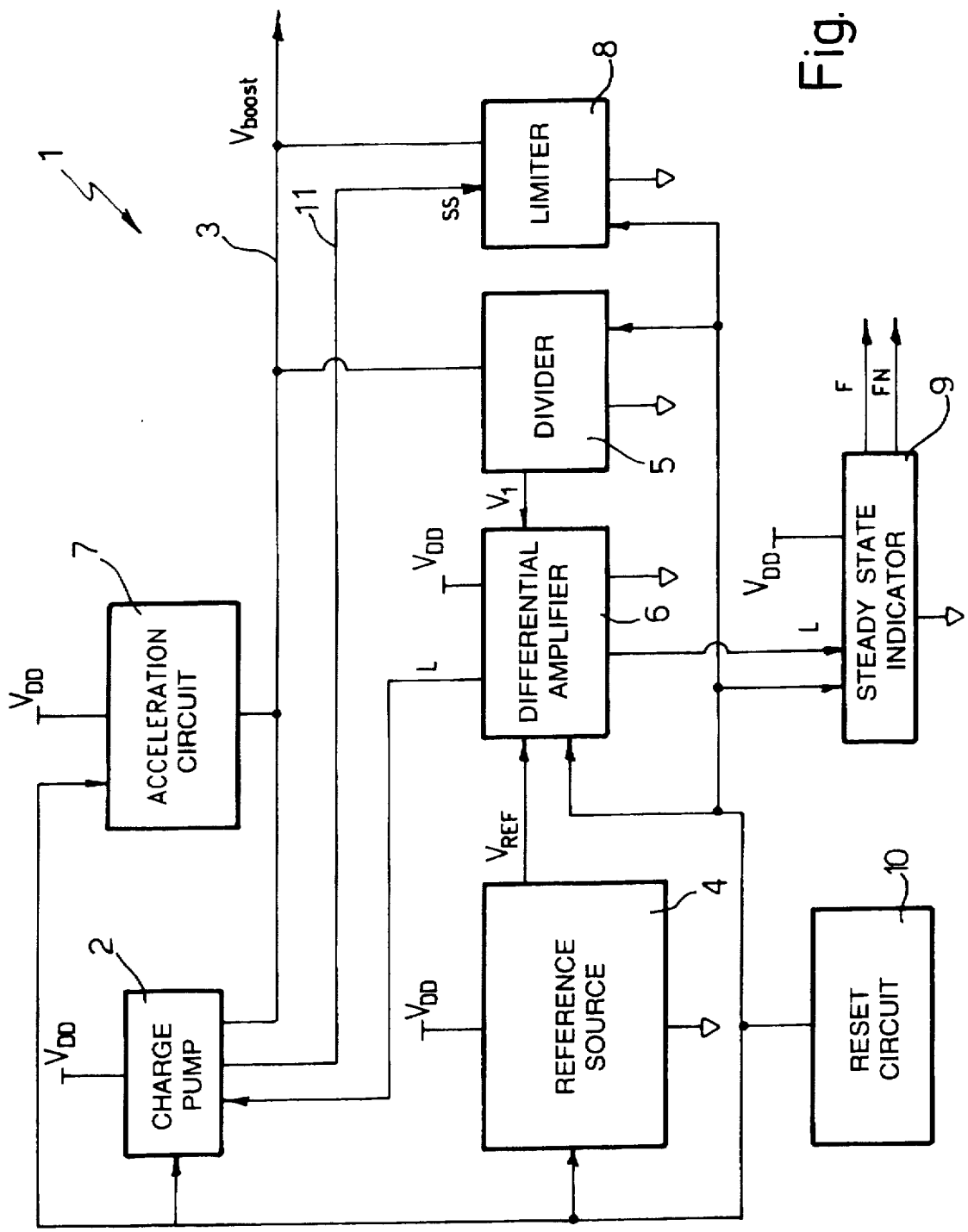
FIG. 1 shows a block diagram of the voltage booster according to the present invention.

In FIG. 1, the booster is indicated as a whole by 1, and substantially comprises a charge pump 2 supplied with voltage $V_{DD}$ and generating a boost voltage Vboost supplied over boost line 3; a reference source 4 for generating a fixed, temperature-stable reference voltage $V_{REF}$ below the minimum operating value of supply voltage $V_{DD}$; a voltage divider 5 connected to boost line 3 and generating a voltage V1 proportional to Vboost; and a differential amplifier 6 input-connected to reference source 4 and voltage divider 5, and output-connected to charge pump 2 to which it supplies an on/off signal L depending on the outcome of a comparison of $V_{REF}$ and $V_I$.

Booster 1 also comprises a acceleration circuit 7 connected to boost line 3, for accelerating the increase in Vboost following low-power operation; a limiter 8 connected to and for limiting the voltage along boost line 3; a steady state value indicator 9 supplied with signal L and generating an output signal indicating the steady state value of Vboost has been reached; and a reset or low-power operation circuit 10 for generating signals for blocks 2, 4–9, and reducing consumption of all the circuits during low-power operation.

More specifically, differential amplifier 6 provides for monitoring Vboost along line 3, comparing a fraction of it with reference voltage $V_{REF}$, and, depending on the value of Vboost, turning the charge pump on or off.

As soon as booster 1 is turned on in low-power mode (in which Vboost equals supply voltage $V_{DD}$ less twice the threshold voltage of a native, i.e. low-threshold, transistor), acceleration circuit 7 is turned on to connect boost line 3 to a voltage equal to $V_{DD}$ and so accelerate the increase in Vboost and overcome the inertia of line 3 due to the high capacitive loads connected to it.

Limiter 8 provides for preventing an excessive increase in Vboost. During operation of charge pump 2, due to the high power of the latter, Vboost may be increased above the required value. To avoid this, limiter 8, which is composed of a series of diodes, discharges boost line 3 groundwards, thus preventing any further increase in Vboost. The operating voltage of limiter 8 may be varied during operation of the charge pump as indicated by signal SS, and as explained below.

Charge pump 2, which may be formed in any appropriate manner and of which a specific circuit diagram is not shown because an acceptable charge pump is of a type known in the prior art, is based on the known principle of alternating two phases of a clock connected to permit charging of a capacitor. The first phase of the clock charges the capacitor with respect to ground up to a supply-related value, and the second phase of the clock pulls up the first side of the capacitor with respect to ground by means of controlled switches, and connects the other side of the capacitor to the output line to achieve an output voltage greater than supply. If desired, two or more capacitors with the appropriate clock signals may be used in charge pump 2. Charge pump 2 is turned on and off by logic signal L generated by differential amplifier 6, and is also turned off by reset circuit 10 to reduce consumption. In a manner not shown, provision may be made for further control signals, e.g. for disabling charge pump 2 during predetermined operating steps of the nonvolatile memory in which the booster is integrated, such as during address reading.

A detailed description will now be given of the circuits relative to blocks 3–10 of the booster, and with reference to FIGS. 2–6.

Figure 2:
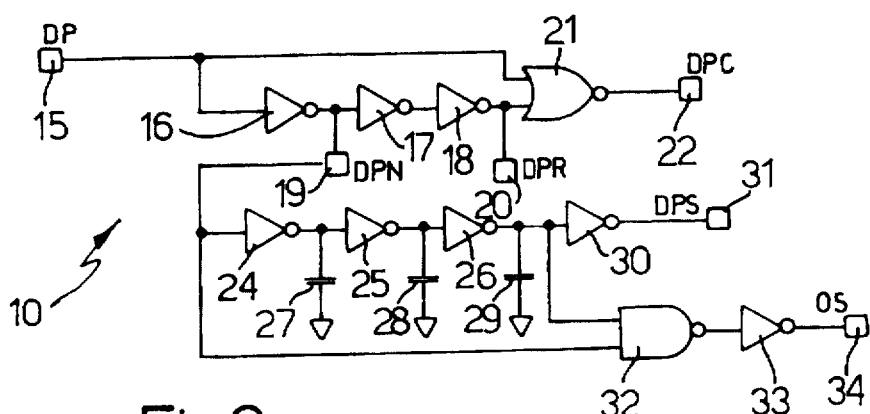
FIG. 2 shows a circuit diagram of a reset circuit in FIG. 1.

FIG. 2 shows a circuit diagram of reset circuit 10 controlling low-power operation of booster 1. Circuit 10 presents an input 15 supplied by an external low-power operation request signal DP also referred to below as a reset signal. Input 15 is connected to a cascade of three inverters 16–18, of which the output of inverter 16 (node 19) generates an inverted reset signal DPN, and the output of inverter 18 (node 20) generates a second inverted reset signal DPR. A NOR circuit 21 presents two inputs connected respectively to input 15 and to the output of inverter 18, and generates (node 22) a normally-low output signal DPC, but which presents a short pulse upon reset signal DP switching to low, due to the slight delay in the switching of signal DPR in relation to DP as a result of the cascade connection of inverters 16–18.

Node 19, at which signal DPN is present, is connected to a second cascade of inverters 24–26, of which the outputs are connected to respective capacitors 27–29 for generating a delay line, and the output of inverter 26 is also connected to a further inverter 30 generating (node 31) an output signal DPS. A NAND circuit 32 presents two inputs connected respectively to node 19 and to the output of inverter-26, and an output connected to an inverter 33. Signal OS at the output of inverter 33 (node 34) is thus normally low, but, like signal DPC, presents a high pulse upon reset signal DP switching to low. In this branch, the duration of the OS signal pulse is determined in known manner by the value of supply voltage $V_{DD}$, and more specifically is inversely proportional to $V_{DD}$. At most, in the case of a high supply voltage $V_{DD}$ (over 6 V), the duration of the pulse is practically zero, for the reasons explained in more detail later on with reference to FIG. 4.

FIG. 3 shows a circuit diagram of differential amplifier 6, divider 5 and reference source 4. Differential amplifier 6 is composed of a pair of N-channel native transistors 38 and 39 having source terminals connected to node 40, gate terminals defining input nodes 41 and 42 of amplifier 6, and drain terminals connected respectively to the drain terminals of P-channel bias transistors 43, 44, the latter of which is diode-connected. Transistors 43, 44 present gate terminals connected to each other, and source terminals connected to supply line $V_{DD}$. Node 40 is connected to the drain terminal of an N-channel native transistor 45, the gate terminal of which is connected to node 41 and to one terminal of capacitor 46. The other terminal of capacitor 46 and the source terminal of transistor 45 are grounded.

Parallel with bias transistor 43, there is provided an N-channel transistor 47 connected between line $V_{DD}$ and drain terminal 66 of transistor 38, and the gate terminal of which is connected to a node 48 supplied with signal DPC (FIG. 2). Node 48 is also connected to the gate terminal of an N-channel native transistor 49 forming part of reference source 4, and the drain and source terminals of which are connected respectively to node 41 and to a diode-connected N-channel transistor 50, the source terminal of which is grounded.

Node 41 is also connected to the drain terminal of an N-channel transistor 51, the gate terminal of which is connected to a node 52, and the source terminal of which is grounded via an N-channel transistor 53, the gate terminal of which defines a node 54 supplied with signal DPN (FIG. 2). Node 52 is connected to the supply line via resistor 55, and to node 41 via a diode-connected N-channel native transistor 56. Node 52 is also connected to the source terminal of a P-channel native transistor 57, the gate and drain terminals of which are respectively grounded and connected to an N-channel native transistor 58, the gate terminal of which receives signal DPN, and the source terminal of which is grounded. The substrate of native transistor 57 is connected to the source terminal of transistor 57 itself, and to the substrate of a P-channel native transistor 60, the source, gate and drain terminals of which are short-circuited to ground, and which thus acts as a capacitance for smoother voltage transition at node 52.

Divider 5 is in the form of a resistive divider composed of a first and second resistor 63, 64 connected in series between boost line 3 and ground. An N-channel native transistor 65 is connected at the drain terminal to resistor 63 (connected to boost line 3) and at the source terminal to resistor 64 and node 42, and is supplied with signal DPN at the gate terminal.

The output of differential amplifier 6, defined by node 66, is connected to the input of an inverter 67, the output of which forms a node 68 at which signal L is present. Node 68 is also connected to supply line $V_{DD}$ via a P-channel transistor 69, the gate terminal of which is supplied with signal DPS (FIG. 2).

The FIG. 3 circuit compares voltage $V_1$ at node 42 with voltage $V_{REF}$ generated by source 4 and which, during normal operation, equals the voltage generated by diode-operating transistors 56 and 57. In this condition, DPN is high so that transistor 58 is turned on, thus grounding the drain terminal of transistor 57 which, also having a grounded gate terminal, operates as a diode. In this phase, transistor 53 is also turned on, thus grounding long, high-resistance transistor 51, which provides for biasing node 41 and preventing it from remaining floating if, for any reason during normal operation, supply voltage $V_{DD}$ should fall, thus resulting in diode transistor 56 being turned off. Transistor 51 also permits reference voltage $V_{REF}$ to be discharged if, for any reason, it should exceed the predetermined value.

During normal operation, signal DPC is low, so that transistors 49, 50, 47 are turned off; the output of amplifier 6 (node 66) presents a high or low level, depending on the comparison of voltages $V_1$ and $V_{REF}$, which level is inverted by inverter 67 to give signal L which is high when $V_1 < V_{REF}$ and is low when $V_1 > V_{REF}$; and signal DPS is high, so that transistor 69 is turned off.

In reset (low power) mode, signals DPN, DPS and DPC are low, thus turning off transistors 58, 53, 65 and maintaining the off condition of transistors 47, 49; node 41 is supply-biased by resistor 55; divider 5 is turned off; node 42 is grounded by resistor 64; and signal L is maintained high by transistor 69 which is turned on.

As already stated, upon reset signal DP switching to low, signal DPC presents a positive pulse which briefly turns on transistors 47 and 49. Consequently, node 66, which was formerly low, is brought to an intermediate level equal to $V_{DD}$ minus the voltage drop at transistor 47 (so designed as to present a high voltage drop), and node 41 is lowered via transistors 49 and 50. Differential amplifier 6 is thus assisted in being brought practically to the operating condition, which is reached when transistor 58 is turned on. Similarly, divider 5 is also made operative upon switching of signal DPN.

FIG. 4 shows a detail of acceleration circuit 7 which comprises a capacitor 75, one terminal of which defines an input node 76 supplied with pulse signal OS, and the other terminal of which defines a node 77 connected to supply line $V_{DD}$ via a diode-connected N-channel native transistor 78. Node 77 is also connected to the gate terminal of an N-channel native transistor 79, the drain terminal of which is connected to supply line $V_{DD}$, and the source terminal of which is connected to boost line 3.

Acceleration circuit 7 operates as follows. As already stated, the OS signal is normally low with the exception of a high pulse generated upon reset signal DP switching to low. In low-power operating mode, node 77 is connected to supply line $V_{DD}$ via diode transistor 78, which presents a voltage drop $V_T$ at its terminals, and input 76 is low. Consequently, capacitor 75 is charged to a voltage of $V_{DD}-V_T$; transistor 79 is turned on and presents a source-gate voltage drop $V_T$; and Vboost is therefore maintained at a value of $V_{DD}-2V_T$. Upon reset signal DP switching to low, the arrival of the OS signal positive pulse pulls up node 76 to a value roughly equal to $V_{DD}$, so that node 77 presents a voltage of $V_{DD}+(V_{DD}-V_T)=2V_{DD}-V_T$, the sum of the voltage at node 76 and the voltage drop of capacitor 75; and the source terminal of transistor 79 (and hence Vboost over line 3) tends towards voltage $V_{DD}$. In actual practice, in view of the loads on boost line 3, Vboost does not actually reach, but is accelerated vigorously towards, the $V_{DD}$ value.

The length of time acceleration circuit 7 remains operative obviously depends on the duration of the OS signal pulse and, as such, is inversely proportional to $V_{DD}$. As $V_{DD}$ increases, the operating time of acceleration circuit 7 decreases so that, for $V_{DD}$ values of over 6 V, the acceleration circuit is practically off (in such a situation in fact operation of the circuit is unnecessary in that Vboost is already at a high level, over 4 V, even in low-power operating mode).

Upon Vboost reaching the steady state value, if supply voltage $V_{DD}$ is low, transistor 79 is disabled, thus separating the supply line from boost line 3; conversely, it connects boost line 3 to the supply.

Figure 5:
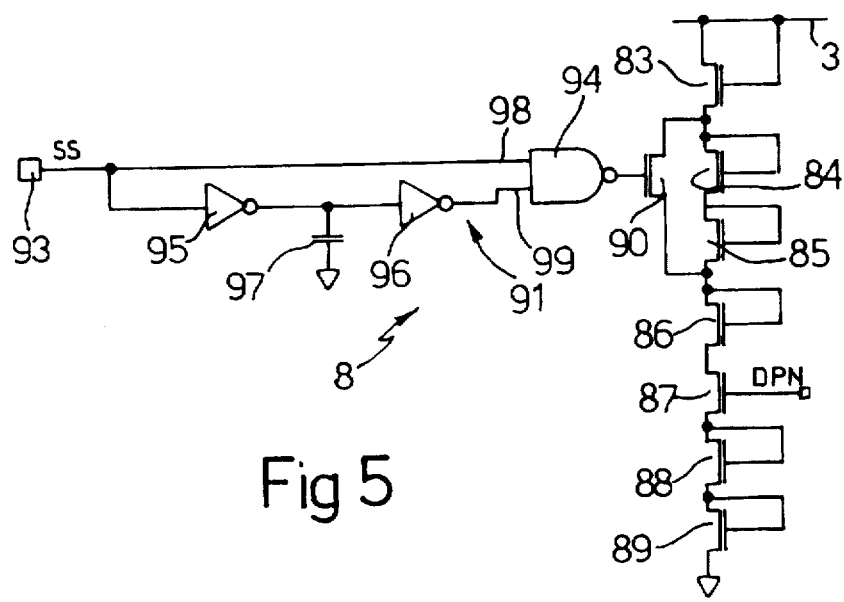
FIG. 5 shows a circuit diagram of a limiter in FIG. 1.

FIG. 5 shows a circuit diagram of limiter 8 which, as already stated, provides for limiting Vboost if, due to the action of charge pump 2, it tends to exceed the set maximum limit. Limiter 8 comprises a number of N-channel transistors 83–89 connected in series between boost line 3 and ground. More specifically, transistors 83–86 and 88, 89 are diode-connected, while transistor 87 acts as a switch, and is supplied at the gate terminal with a control signal consisting of the inverted reset signal DPN generated by reset circuit 10. The drain terminal of transistor 84 and the source terminal of transistor 85 are connected to respective drain and source terminals of an N-channel transistor 90, the drain terminal of which is controlled by the output signal of a filter circuit 91.

Filter circuit 91 presents an input 93 supplied with the SS signal generated by charge pump 2 (FIG. 1) and which, during operation of the pump, oscillates at a predetermined frequency, and, when the pump is off, presents a high logic level. Input 93 is connected directly to first input 98 of a NAND circuit 94, and to a second input (node 99) of NAND circuit 94 via the cascade connection of two inverters 95, 96. The node between the output of inverter 95 and the input of inverter 96 is connected to one terminal of a capacitor 97, the other terminal of which is grounded. Inverters 95, 96 and capacitor 97 are designed to form an asymmetric delay line for responding rapidly to high-to-low switching and slowly to low-to-high switching of the SS signal, so that, as the SS signal begins to oscillate, the signal at node 99 of NAND circuit 94 switches to low where it substantially remains until the SS signal ceases to oscillate, at which point, after a certain amount of delay, the signal at node 99 switches back to high.

Consequently, as long as the pump is off (steady state value of Vboost or low-power operating mode), signal SS and the signal at node 99 are high, so that the output of NAND circuit 94 is low, and transistor 90 remains off. If, at the same time, booster 1 is in low-power operating mode (DP signal high and DPN low), transistor 87 is also off, the series of diodes 83–86, 88, 89 is interrupted, and limiter 8 is disabled. Conversely, if booster 1 is in normal operating mode (DP low, DPN high), the series of diodes 83–89 grounds boost line 3, thus preventing Vboost from exceeding the value set by diodes 83–86, 88, 89 and equal to six times the threshold voltage of each diode.

As soon as charge pump 2 is started, the SS signal begins oscillating, node 99 switches to low, and the output of NAND circuit 94 switches to high, thus turning on transistor 90 which by-passes diode transistors 84, 85. In this phase, therefore, the (rated) operating voltage of limiter 8 is determined by the total threshold voltage of only four diodes (83, 86, 88, 89). This is recommendable on two counts: firstly, on account of the very high charge and, hence, rapid increase in the value of Vboost effected by charge pump 2; and secondly, on account of the inertia of limiter 8 (delay in the diodes becoming fully conductive) which, with no reduction in its rated operating voltage, would fail to prevent Vboost from greatly exceeding the desired maximum value. Conversely, by reducing the rated operating voltage of limiter 8 during operation of pump 2, Vboost is safely prevented from exceeding the set nominal value, even in the event of a sharp increase in Vboost and sluggish operation of diodes 83, 86, 88, 89.

Figure 6:
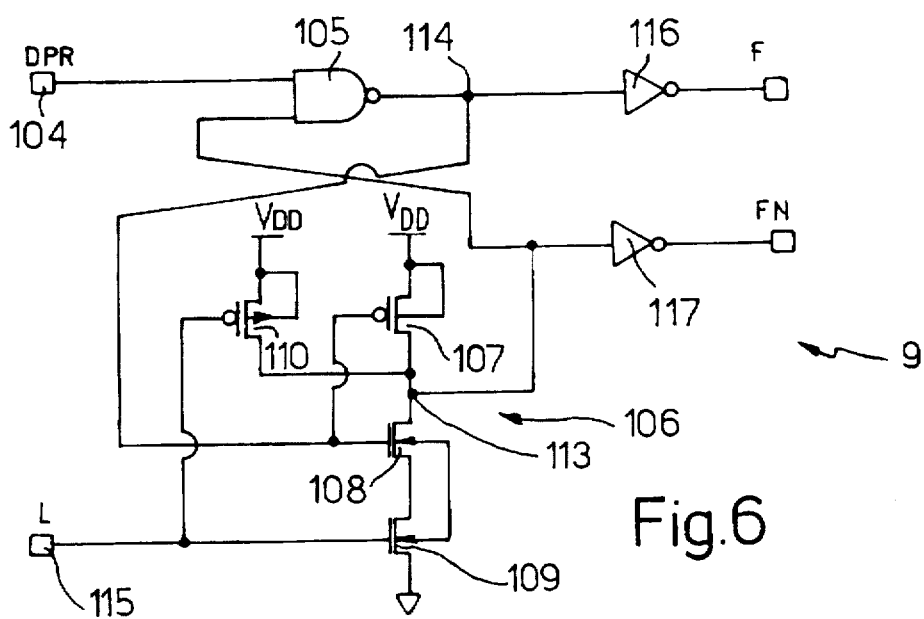
FIG. 6 shows a circuit diagram of a steady state indicator in FIG. 1.

As shown in FIG. 6, circuit 9 is substantially composed of a flip-flop, the output of which switches to a first logic level upon Vboost switching from low-power operating mode to the steady state value, and is reset to a second logic level in low-power operating mode.

More specifically, circuit 9 comprises a first NAND circuit 105 with two inputs connected respectively to the input node 104 of circuit 9 (supplied with inverted reset signal DPR) and to the output of a second NAND circuit 106 composed of transistors 107–110. Transistor 107 is a P-channel native transistor, and presents a source terminal connected to supply line $V_{DD}$, a drain terminal defining the output node 113 of NAND circuit 106, and a gate terminal connected to the output of NAND circuit 105 (node 114). Transistor 108 is an N-channel type, and presents a drain terminal connected to node 113, a gate terminal connected to node 114, and a source terminal connected to the drain terminal of transistor 109. Transistor 109 is an N-channel type, and presents a grounded source terminal, and a gate terminal connected to input node 115 of circuit 9, which is supplied with charge pump enabling signal L.

Node 115 is also connected to the gate terminal of P-channel native transistor 110, which presents a source terminal connected to supply $V_{DD}$, and a drain terminal connected to node 113.

Node 114 is connected to the input of a first inverter 116, the output of which presents logic signal F; and node 113 is connected to the input of a second inverter 117, the output of which presents logic signal FN.

NAND circuit 106 is thus similar to 105, the P-channel transistors of which are replaced by P-channel native transistors.

Circuit 9 operates as follows. In low-power operating mode, signal DPR is low; signal L is high (see FIG. 2 in which DPS is low); node 114 is high; transistors 107 and 110 are off; transistors 108 and 109 are on; node 113 is low; and signals F and FN are respectively low and high indicating Vboost is not at the steady state value. At the end of low-power operating mode, signal DPR switches to high, without affecting circuit 9, until signal L switches.

As already explained in connection with FIG. 3, L switches to low upon Vboost reaching the steady state value, in which case, transistor 109 is turned off; transistor 110 is turned on, thus switching node 113 to high; NAND circuit 105 switches, the output node 114 of which switches to low, thus turning off transistor 108 and turning on transistor 107; output signal F switches to high to indicate a steady state value of Vboost; and signal FN switches to low.

Circuit 9 is reset upon signal DPR switching to low (low-power operating mode) and signal L again switching to high.

The advantages of the booster according to the present invention are the following. Firstly, it provides for controlling the Vboost value, and involves no calibration for regulating the power and/or operating time of the charge pump according to the supply voltage, by virtue of on/off operation of the pump being closed-loop controlled by comparing the actual Vboost value with a desired steady state value.

Moreover, the booster functions correctly even at very low supply voltages, by virtue of generating a low reference voltage, and comparing this with an appropriate fraction of the Vboost voltage.

The booster according to the present invention provides for rapidly attaining the steady state Vboost value, and for rapidly switching from low-power to steady state operation by virtue of featuring components by which the transient reactivating states are assisted and accelerated.

Being self-regulating with a limiting circuit, the booster provides for a high degree of reliability even in the event of unforeseen situations occurring, thus ensuring start-up of the charge pump in the presence of too low a Vboost value, and preventing the Vboost value from exceeding the desired maximum limit.

It will be clear that changes may be made to the booster as described and illustrated herein without, however, departing from the scope of the present invention. In particular, the FIG. 1 blocks may be formed otherwise than as shown in FIGS. 2–6; the booster may comprise more or fewer blocks as compared with FIG. 1, providing it comprises a charge pump section and a section for closed-loop control of the pump for maintaining the Vboost value within a predetermined range; and the transistors may be replaced with others of a different channel type or technology.

We claim:

1. A voltage booster coupled to a power supply and comprising:

a charge pump circuit having an output connected to a boost line presenting a boost voltage;

enabling means connected to said charge pump circuit and to said boost line for generating enabling and disabling signals for said charge pump circuit when the value of said boost voltage is respectively below and above predetermined limits, said enabling means including a comparing means for comparing a reference voltage with a voltage that is a function of said boost voltage; and an acceleration circuit, including a transistor coupled between the power supply and said boost line, to couple said boost line to the power supply, via said transistor, for a predetermined period of time to thereby increase the speed with which said boost line presents said boost voltage.

2. A booster as claimed in claim 1 wherein said enabling means includes a reference source generating said reference voltage.

3. A booster as claimed in claim 1 wherein said enabling means includes a voltage divider connected to said boost line and having an intermediate tap terminal connected to said comparing means and providing a voltage whose value is related to said boost voltage.

4. A booster as claimed in claim 1 wherein said comparing means includes a differential amplifier.

5. A booster as claimed in claim 1 wherein said enabling means is interposed between a first and second reference potential line and includes first switch means having control inputs supplied with control signals indicating low-power operation, for interrupting the electrical continuity between said first and second reference potential lines upon receiving said control signals.

6. A booster as claimed in claim 5 wherein said comparing means includes:

a reference input;

an output;

first enabling pulse generating means for generating a first enabling pulse upon termination of said low-power operation;

first bias means having a first enabling input connected to said first enabling pulse generating means, and a first bias terminal connected to said output for momentarily biasing said output upon receiving said first enabling pulse; and second bias means having a second enabling input connected to said first enabling pulse generating means, and a second bias terminal connected to said reference input for momentarily biasing said reference input upon receiving said first enabling pulse.

7. A booster as claimed in claim 6 which includes second enabling pulse generating means for generating a second enabling pulse upon termination of said low-power operation; said acceleration circuit having an input connected to said second enabling pulse generating means, and an output connected to said boost line.

8. A booster as claimed in claim 7 wherein said acceleration circuit includes capacitive means having a first boost terminal connected to said second enabling pulse generating means, and a second boost terminal connected to a first reference voltage less than the power supply and to said boost line via second switch means and said transistor, said second switch means separating said second boost terminal from the power supply upon receiving said second enabling pulse, and said transistor connecting said boost line to said first reference voltage at least in low-power operating conditions, and connecting said boost line to the power supply in the presence of said second enabling pulse.

9. A booster as claimed in claim 1 which further comprises a voltage limiter interposed between said boost line and a second reference potential line.

10. A booster as claimed in claim 9 wherein said voltage limiter includes a plurality of diode elements connected in series with one another.

11. A booster as claimed in claim 10 wherein said voltage limiter includes a by-pass element having a control terminal and by-pass terminals connected to predetermined said diode elements; said control terminal being connected to said charge pump circuit and being supplied with a pump operation signal so as to by-pass said predetermined diode elements upon receiving said pump operation signal.

12. A booster as claimed in claim 10 wherein said voltage limiter includes fourth switch means having a control input supplied with a control signal indicating low-power operation, for interrupting the electrical continuity between said boost line and said second reference potential line upon receiving said control signal.

13. A booster as claimed in claim 1, further comprising a steady state indicating circuit connected to said enabling means and generating a logic signal indicating a steady state value of said boost voltage.

14. A voltage booster circuit receiving a supply voltage and generating a boost voltage greater than the supply voltage, the voltage booster circuit comprising:

a charge pump for providing the boost voltage on an output line;

a feedback controller coupled to the charge pump and adapted to receive the boost voltage, the feedback controller providing a control signal as a function of the boost voltage, the charge pump being adapted to receive the control signal so that the boost voltage is a function of the control signal; and an acceleration circuit to operatively couple the output line to the supply voltage to accelerate a transition of the output line to a voltage level within a predetermined threshold of the supply voltage.

15. The voltage booster circuit of claim 14, wherein the feedback controller includes:

a divider for providing a boost signal which is proportional to the boost voltage;

a reference source for providing a reference signal; and a comparator for comparing the boost signal and the reference signal and providing the control signal as a function of the comparison.

16. The voltage booster circuit of claim 15, wherein the comparator is a differential amplifier, wherein the control signal enables the charge pump when the boost signal is less than the reference signal and disables the charge pump when the boost signal is greater than the reference signal.

17. The voltage booster circuit of claim 14, further comprising a limiter coupled to the charge pump and adapted to receive the boost voltage, the limiter restricting the boost voltage to a high limit voltage.

18. The voltage booster circuit of claim 17, wherein the charge pump is adapted to provide a low limit voltage selection signal when the charge pump is enabled, wherein the limiter is adapted to receive the low limit voltage selection signal and in response to restrict the boost voltage to a low limit voltage.

19. The voltage booster circuit of claim 14, further comprising:

a reset circuit coupled to the charge pump, the reset circuit for providing a reset signal which disables the charge pump in order to initiate a low power condition in the voltage booster circuit, the reset circuit also for providing an accelerate signal to activate said acceleration circuit.

20. A method of providing a boost voltage greater than a supply voltage, the method comprising:

providing a charge pump for outputting the boost voltage at an output line;

temporarily coupling the output line to the supply voltage to accelerate a transition of the output line to a voltage level within a predetermined threshold of the supply voltage;

generating a reference voltage;

generating a boost signal which is proportional to the boost voltage;

when the boost signal is less than the reference voltage, enabling the charge pump;

when the boost signal is more than the reference voltage, disabling the charge pump; and outputting the boost voltage from the charge pump.

21. A memory system having a memory and a voltage booster circuit, the voltage booster circuit for providing a boost voltage greater than a supply voltage, the voltage booster circuit comprising:

a charge pump for providing the boost voltage;

a divider coupled to the charge pump and adapted to receive the boost voltage, the divider for providing a boost signal which is proportional to the boost voltage;

a reference source for providing a reference signal;

a comparator coupled to the charge pump, the reference source and the divider and adapted to receive the reference signal and the boost signal, the comparator for comparing the boost signal and the reference signal and providing a control signal as a function of the comparison, wherein the charge pump is adapted to receive the control signal so that the boost voltage is a function of the control signal;

a limiter coupled to the charge pump and adapted to receive the boost voltage, the limiter for restricting the boost voltage to a limit voltage;

a reset circuit coupled to the charge pump to provide a reset signal which disables the charge pump in order to initiate a low power condition in the voltage booster circuit, the reset circuit also for providing an accelerate signal; and an acceleration circuit coupled to the reset circuit and the charge pump and adapted to receive the accelerate signal, the acceleration circuit temporarily setting the boost voltage equal to the supply voltage in order to initiate a normal condition in the voltage booster circuit.

22. A voltage booster circuit that outputs a boost voltage greater than a supply voltage, the voltage booster circuit comprising:

a charge pump, having an active mode and a standby mode, and receiving a control signal and providing the boost voltage at an output terminal as a function of the control signal;

a comparator coupled to the charge pump and receiving a voltage which is proportional to the boost voltage, the comparator comparing the proportional voltage to a reference voltage and providing the control signal as a result of the comparison;

a voltage reference source coupled to the comparator to generate the reference voltage; and an active voltage limiter coupled between the output terminal and a reference signal level, the voltage limiter comprising a plurality of series connected semiconductor devices to define a first threshold when the charge pump is in the standby mode wherein the boost voltage is limited to an output voltage related to the first threshold when the charge pump is in the standby mode, the voltage limiter further comprising a bypass semiconductor element selectively activated to bypass at least one of the series connected semiconductor devices when the charge pump is in the active mode to define a second threshold less than the first threshold wherein the boost voltage is limited to an output voltage related to the second threshold when the charge pump is in the active mode.

23. The voltage booster circuit of claim 22 wherein the comparator includes a differential amplifier, wherein the control signal enables the charge pump when the proportional voltage is less than the reference voltage and disables the charge pump when the proportional voltage is greater than the reference voltage.

24. The voltage booster circuit of claim 22, further comprising:

a reset circuit coupled to the charge pump, the reset circuit outputting a reset signal which disables the charge pump in order to initiate a low power condition in the voltage booster circuit, the reset circuit also for providing an accelerate signal; and an acceleration circuit coupled to the reset circuit and the charge pump and receiving the accelerate signal, the acceleration circuit temporarily making the boost voltage equal to the supply voltage in order to initiate a normal condition in the voltage booster circuit.

25. A voltage booster coupled to a power supply and comprising:

a charge pump circuit having an output connected to a boost line to generate a boost voltage at said output;

a control circuit connected to said charge pump circuit and to said boost line to generate enabling and disabling signals for said charge pump circuit, said control circuit generating said enabling signals when the value of said boost voltage is below a predetermined lower limit and generating said disabling signals when the value of said boost voltage is above an upper predetermined limit, said control circuit including a reference source to generate a reference voltage that is independent of the power supply and is independent of temperature variations and a comparator circuit to compare said reference voltage with a voltage that is a function of said boost voltage; and an acceleration circuit coupled between the power supply and said boost line and operative to couple said boost line to the power supply via a transistor for a predetermined period.

26. A voltage booster circuit receiving a supply voltage and generating a boost voltage greater than the supply voltage, the voltage booster circuit comprising:

a charge pump for providing the boost voltage on an output line;

a feedback controller coupled to the charge pump and adapted to receive the boost voltage, said feedback controller providing a control signal as a function of the boost voltage, said charge pump being adapted to receive said control signal so that the boost voltage is a function of said control signal;

a control capacitor having a first end coupled to a circuit node and a second end coupled to a circuit timing element that is activated for a predetermined period of time; and a transistor having a first terminal coupled to the supply voltage, a second terminal coupled to said output line, and a control terminal coupled to said circuit node wherein said transistor is activated for said predetermined period of time to thereby accelerate the voltage on said output line to the supply voltage.

* * * * *

UNITED STATES PATENT AND TRADEMARK OFFICE
CERTIFICATE OF CORRECTION

PATENT NO.     : 5,768,115
DATED          : June 16, 1998
INVENTOR(S)    : Luigi Pascucci et al.

It is certified that error appears in the above identified patent and that said Letters Patent is hereby corrected as shown below:

On the cover page, item [21], before 855,922, please insert -- 08/ --.

On the cover page, item [30], please delete "[DE]", and insert -- [EP] --.

On the cover page, item [30], please delete "Germany", and insert -- Europe --.

Signed and Sealed this

Sixteenth Day of May, 2000

Attest:

Q. TODD DICKINSON

*Attesting Officer*     *Director of Patents and Trademarks*